United States Patent
Cheung et al.

(10) Patent No.: US 6,258,223 B1
(45) Date of Patent: Jul. 10, 2001

(54) IN-SITU ELECTROLESS COPPER SEED LAYER ENHANCEMENT IN AN ELECTROPLATING SYSTEM

(75) Inventors: Robin Cheung, Cupertino; Daniel A. Carl, Pleasanton; Yezdi Dordi, Palo Alto; Peter Hey, Sunnyvale; Ratson Morad, Palo Alto; Liang-Yuh Chen, Foster City; Paul F. Smith, San Jose; Ashok K. Sinha, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,877

(22) Filed: Jul. 9, 1999

(51) Int. Cl.⁷ .................................................. C25D 17/00
(52) U.S. Cl. ........................................ 204/242; 204/269
(58) Field of Search .................................. 204/242, 267, 204/269

(56) References Cited

U.S. PATENT DOCUMENTS

| | | | |
|---|---|---|---|
| 4,265,943 | 5/1981 | Goldstein et al. | 427/305 |
| 5,344,491 * | 9/1994 | Katou | 118/695 |
| 5,384,284 | 1/1995 | Doan et al. | 437/190 |
| 5,415,890 * | 5/1995 | Kloiber et al. | 427/242 |
| 5,510,216 | 4/1996 | Calabrese et al. | 430/16 |
| 5,846,598 | 12/1998 | Semkow et al. | 427/98 |
| 5,885,749 | 3/1999 | Huggins et al. | 430/312 |
| 5,891,513 | 4/1999 | Dubin et al. | 427/98 |
| 5,907,790 | 5/1999 | Kellam | 438/666 |
| 5,913,147 | 6/1999 | Dubin et al. | 438/687 |
| 5,932,077 * | 8/1999 | Reynolds | 204/273 |
| 6,004,828 * | 12/1999 | Hanson | 438/7 |
| 6,099,712 * | 8/2000 | Ritzdorf et al. | 205/123 |
| 6,136,163 * | 10/2000 | Cheung et al. | 204/198 |

OTHER PUBLICATIONS

Lowenheim, Frederick A., "Modern Electroplating," 3rd Edition, Chapter 31, pp. 710–747. Month not available.

* cited by examiner

Primary Examiner—Kathryn Gorgos
Assistant Examiner—Erica Smith-Hicks
(74) Attorney, Agent, or Firm—Thomason, Moser & Patterson, L.L.P.

(57) ABSTRACT

The present invention discloses a system that provides for electroless deposition performed in-situ with an electroplating process to minimize oxidation and other contaminants prior to the electroplating process. The system allows the substrate to be transferred from the electroless deposition process to the electroplating process with a protective coating to also minimize oxidation. The system generally includes a mainframe having a mainframe substrate transfer robot, a loading station disposed in connection with the mainframe, one or more processing facilities disposed in connection with the mainframe, an electroless supply fluidly connected to the one or more processing applicators and optionally includes a spin-rinse-dry (SRD) station, a rapid thermal anneal chamber and a system controller for controlling the deposition processes and the components of the electro-chemical deposition system.

9 Claims, 14 Drawing Sheets

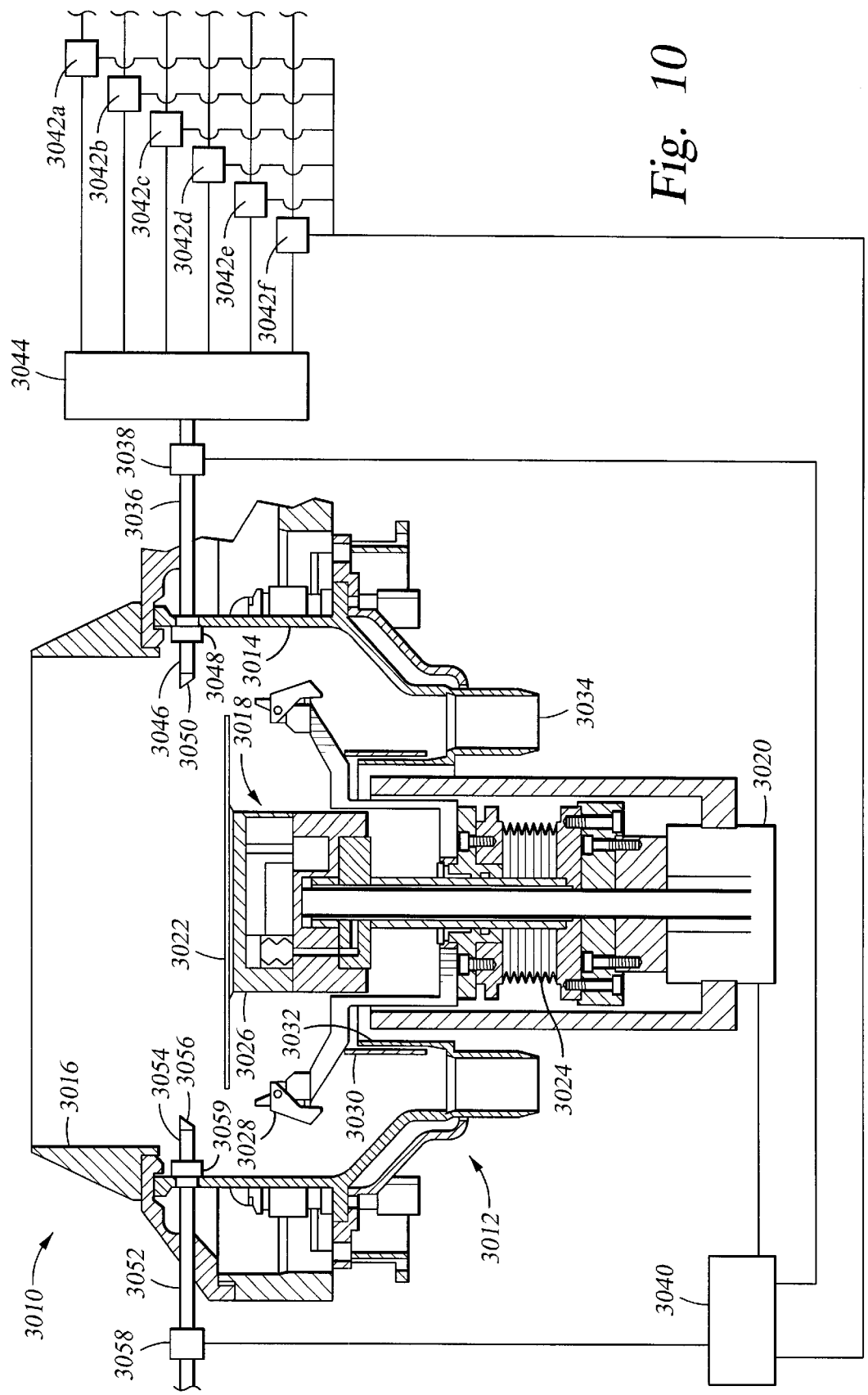

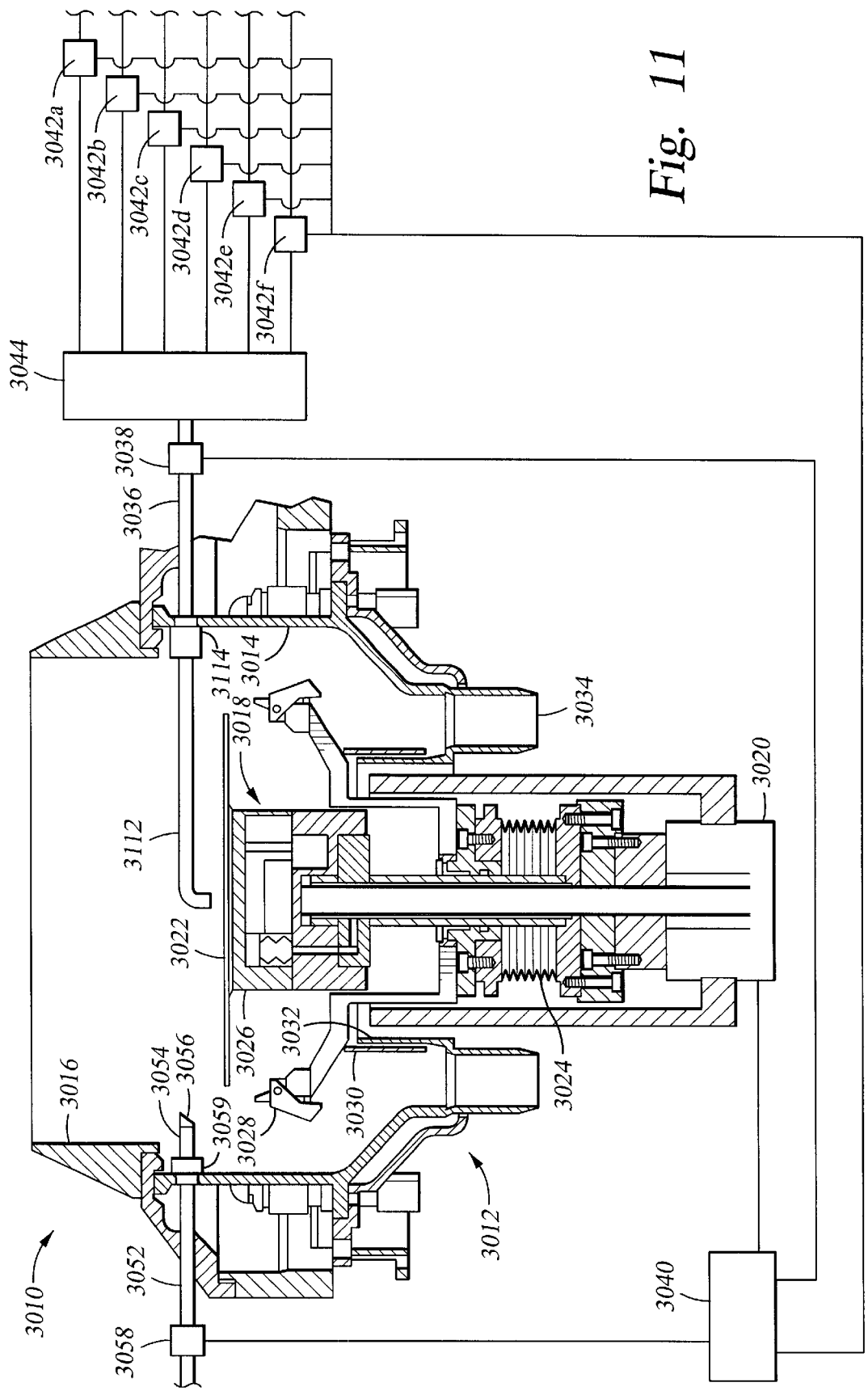

IN-SITU ELECTROLESS COPPER SEED LAYER ENHANCEMENT IN AN ELECTROPLATING SYSTEM

BACKGROUND OF THE INVENTION

1. Field of the Invention

The present invention relates generally to the fabrication of integrated circuits on substrates. More specifically, the invention relates to a system and method that deposits an electroless seed layer prior to electroplating on the substrate.

2. Background of the Invention

Sub-quarter micron multilevel metallization represents one of the key technologies for the next generation of ultra large scale integration (ULSI) for integrated circuits. Reliable formation of multilevel interconnect features, including contacts, vias, lines, and trenches is very important to the success of ULSI and to the continued effort to increase circuit density on individual substrates and die. As circuit densities increase, the widths of vias, contacts and other features decrease to 0.25 $\mu$m or less, whereas the thicknesses of the dielectric layers remains substantially constant, with the result that the aspect ratios for the features, i.e., their height divided by width, increases. Many traditional deposition processes have difficulty filling strictures where the aspect ratio exceeds 6:1, and particularly where it approaches 10:1.

One traditional process is a physical vapor deposition (PVD) process. Generally, bias is created in a PVD chamber between a target having sputterable material and a substrate on which the material is to be sputtered. An inert gas is flown into the chamber and a plasma is created of inert gas ions between the target and substrate. The inert gas ions impact the target, dislodge the target material, and some of the material is directed to the substrate and deposited thereon. FIG. 1a is a side view schematic of material deposited in a feature with PVD processing. In high aspect ratio features, the deposition from a PVD process is typically concentrated near the opening of the feature and leaves voids in the deposition in the lower portions of the features such as the bottom and corners of the feature. The opening can become sealed creating a void in the feature, leading to defects in the substrate.

One alternative to traditional PVD processing that has recently been developed is a high pressure PVD process, which ionizes the target material after it has been sputtered and directs the target material in an highly aligned path parallel to the depth of the high aspect features. Such a process, known as an ionized metal plasma (IMP) process, deposits more material on the bottom of the feature than traditional PVD processing. PVD processing and high pressure PVD processing is described in co-pending U.S. Ser. No. 08/989,759 filed Dec. 12, 1997 and is incorporated herein by reference. FIG. 1b is a side view schematic of material deposited in a feature with IMP processing. However, the ionized material does not uniformly deposit on the sidewalls of the feature, particularly near the middle of the feature. As the deposit increases, the opening can be closed, also creating a void near the middle of the feature.

Because of the difficulties in filling high aspect ratio features, processes other than PVD are being developed to deposit metals such as copper or aluminum. Electroplating, used in other industries, has recently been explored as a viable alternative for filling sub-quarter micron features. Generally, the electroplating process is able to grow the deposited material on a conductive surface and fill even the high aspect ratio features substantially free of voids.

Typically, electroplating uses a suspension of generally positively charged ions of deposition material in contact with a negatively charged substrate, as a source of electrons, to plate out the deposition material on the charged substrate. On a typical non-conductive substrate, a thin conductive material is first deposited on the substrate and in the features and provides an electrical path across the surfaces. An electrical current is supplied to the conductive material and the substrate is electroplated with an appropriate conductive material, such as aluminum or copper. However, the integrity of the initial conductive material layer determines the integrity of the subsequent electroplated layer. For instance, discontinuities in the initial conductive layer can affect the electrical current and cause defects in the electroplated layer.

Therefore, there remains a need to provide a system and method that extends the reliability of depositions in features by enhancing an initial conductive layer for a subsequent electroplating process.

SUMMARY OF THE INVENTION

The present invention generally provides a system and method that deposits an electroless seed layer on a substrate prior to subsequent processing. The system is designed with flexible architecture and can be configured in several ways. The electroless deposition process is preferably performed in-situ with an electroplating process to minimize oxidation and other contaminants prior to the electroplating process. The system allows the substrate to be transferred from an electroless deposition processing area to an electroplating processing area with a protective coating to also minimize oxidation. The system generally includes a mainframe having a mainframe substrate transfer robot, a loading station disposed in connection with the mainframe, one or more processing facilities disposed in connection with the mainframe, and an electroless supply fluidly connected to the one or more processing applicators. Preferably, the electro-chemical deposition system includes a spin-rinse-dry (SRD) station disposed between the loading station and the mainframe, a rapid thermal anneal chamber attached to the loading station, and a system controller for controlling the deposition processes and the components of the electro-chemical deposition system. The electroless deposition fills defects and discontinuities in the activation, or seed, layer and allows subsequent processing, such as electroplating, to fill the remainder of the features without substantial voids in the deposited material.

In one aspect, the invention provides a system for depositing a conductive layer on a substrate, comprising an electroplating processing mainframe having a transfer robot, a loading station coupled to the mainframe, an electroless deposition applicator coupled to the mainframe, and an electroless deposition fluid supply fluidly connected to the electroless deposition applicator. In another aspect, the invention provides a system for depositing a conductive layer on a substrate, comprising a chamber having a bottom and a sidewall, a pedestal disposed in the chamber, a first fluid inlet disposed proximate the pedestal and fluidicly connected to a supply of electroless deposition fluid, a second fluid inlet disposed proximate the pedestal and fluidicly connected to a supply of rinsing fluid, and an actuator coupled to the pedestal. In another aspect, the invention provides a method for depositing a conductive layer in a feature on a substrate, comprising depositing a first conductive layer in a feature on the substrate, depositing by an electroless deposition process a second conductive layer in the feature, and electroplating a third conductive layer in the feature to at least partially fill the feature.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 10 is a schematic perspective view of one electroless deposition process (EDP) cell 2010.

FIG. 11 is a schematic side view of an alternative embodiment of an EDP cell.

DETAILED DESCRIPTION OF THE PREFERRED EMBODIMENT

Figure 1A:
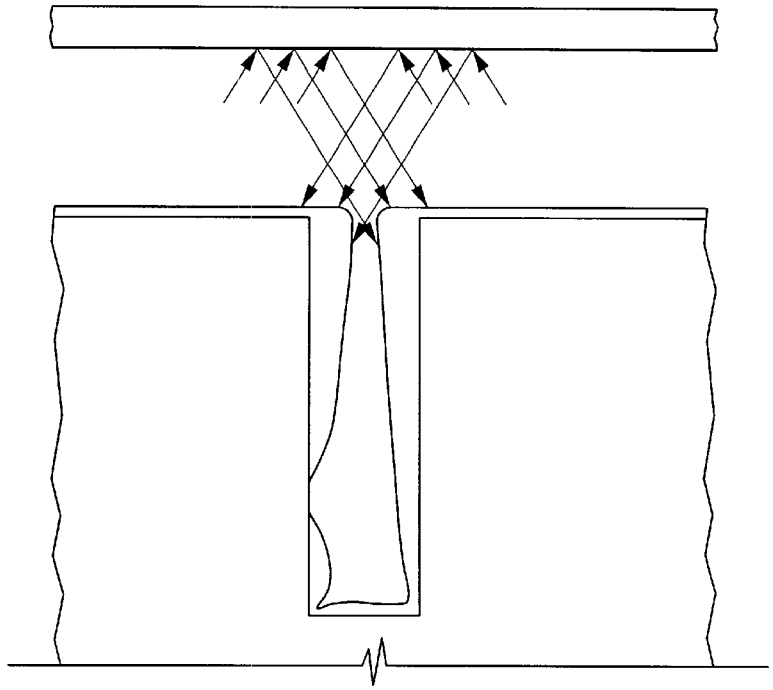
FIG. 1a is a side view schematic of material deposited in a feature with physical vapor disposition (PVD) processing.
Figure 1B:
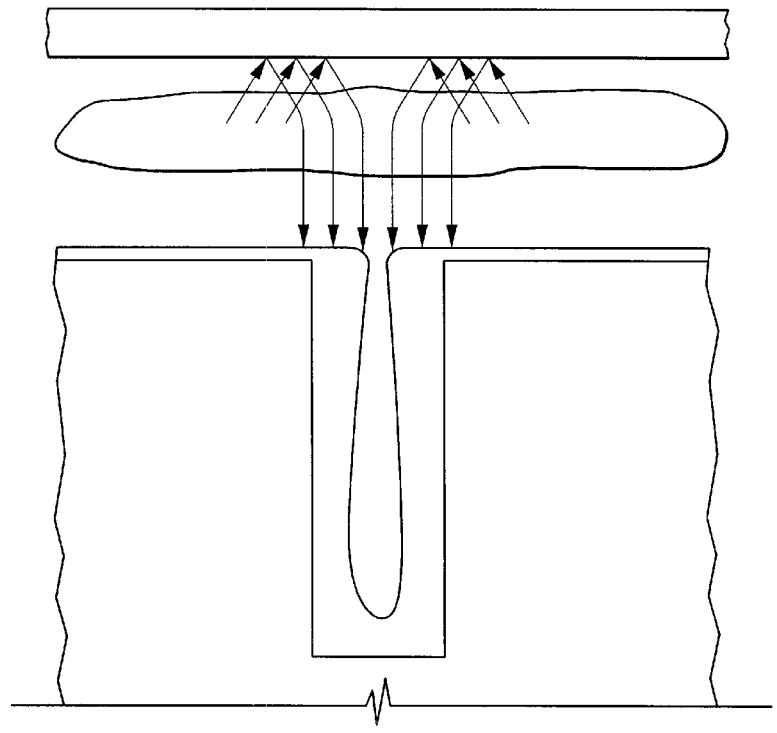
FIG. 1b is a side view schematic of material deposited in a feature with high pressure PVD processing.

The present invention uses a system and method for depositing a seed layer conformally on a substrate, depositing an electroless conductive layer conformally on the seed layer, and electroplating a layer over the electroless layer preferably to fill features on the substrate. The electroless deposition process can be included in situ with a system having one or more electroplating cells. The electroless process can be performed as a bath deposition, a spray deposition, or a globule deposition. The electroless process can be performed by an electroless deposition applicator on a substrate while transferring the substrate within the system, while the substrate awaits transfer to a subsequent process, or in a separate cell.

Electroless deposition is a process for depositing conductive materials over a catalytically active surface by chemical reduction in the absence of an external electric current. Typical metals that are deposited by electroless deposition include copper and nickel and can include such metals as gold, palladium, cobalt and tin-lead alloys. Electroless deposition is a selective deposition and occurs at those locations where a catalytic material already exists. For instance, the electroless deposition of copper can occur at locations having exposed copper, gold, silver, or platinum. Also, iron, cobalt, nickel, palladium, or rhodium surfaces can be used to promote electroless deposition of copper thereon. The electroless process is self-perpetuating to the extent of the availability of the electroless deposition solution and other reactive conditions. The electroless deposition herein is discussed in context of a copper deposition, but the invention applies to a variety of materials that can be deposited from electroless solutions. Descriptions of the electroless deposition process in Chapter 31 of *Modern Electroplating*, F. Lowenheim, (3d ed.) and in U.S. Pat. No. 5,891,513 are incorporated herein by reference.

For electroless deposition of copper, one chemistry known in the art includes a copper source, a supply of hydroxide ions to adjust the pH, an acid as a reducing agent, and a surfactant as a wetting agent. Furthermore, because copper tends to precipitate above a pH of 3.5, the solution can include an acid, as a complexing agent, to maintain the copper in solution, and a stabilizer. One exemplary solution includes 0.015 mol/liter to about 0.08 mol/liter of copper sulfate, 0.04 mol/liter to about 0.2 mol/liter of ethylenediaminetetraacetic acid (EDTA) as a complexing agent, 0.45 mol/liter to about 0.6 mol/liter of quaternary ammonium hydroxides, such as tetramethylammonium hydroxide (TMAH), or potassium hydroxide (KOH) to supply the OH- to achieve a pH preferably above about 11, 0.06 mol/liter to about 1.0 mol/liter of formaldehyde (HCHO) or glyoxylic acid as the reducing agent, and 1 gm/liter to about 6 gm/liter of nonyl-phenol-ethoxilated phosphate ester (CAS 68412-53-3), known as RHODAFAC RE 610 as the surfactant. The electroless deposition process is a heated process that either heats the electroless deposition fluid or the substrate and preferably both to a temperature between about 15° C. to about 100° C., preferably between about 50° C. to about 70° C., and most preferably about 60° C. A typical chemical reaction among the principal components can be expressed as:

$$Cu^{2+} + 2HCHO + 4OH^- \rightarrow Cu^\circ \downarrow + H_2 \uparrow + 2H_2O + 2HCOO^-$$ 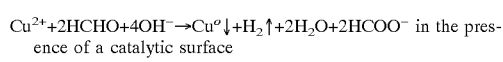 in the presence of a catalytic surface The reaction thus delivers two electrons to the copper which allows the copper to deposit on the catalytic surface and hydrogen gas is produced as a byproduct. The components of the solution can be mixed in deionized water. After deposition, the surface of the substrate can be rinsed with deionized water to remove the remaining electroless deposition solution. In tests, the electroless deposition solution deposits material at a rate of about 400 Å per minute and, therefore, a 100 Å seed layer would be created in about 15 seconds for a subsequent deposition process such as electroplating.

The preferred method uses an ionized metal plasma (IMP) process to create a seed layer prior to using the electroless deposition fluid process that enhances the seed layer. Generally, IMP is an extension of PVD technology. Sputtered metal atoms are ionized by passing the atoms through a plasma generated in a deposition chamber between the target and the substrate, described below. An electric field, or self-bias, develops in the boundary layer, or sheath, between the plasma and the substrate that accelerates the metal ions towards the substrate in a vector perpendicular to the substrate surface. The bias energy can be modulated on the substrate by an optional application of power, such as RF power.

Figure 2:
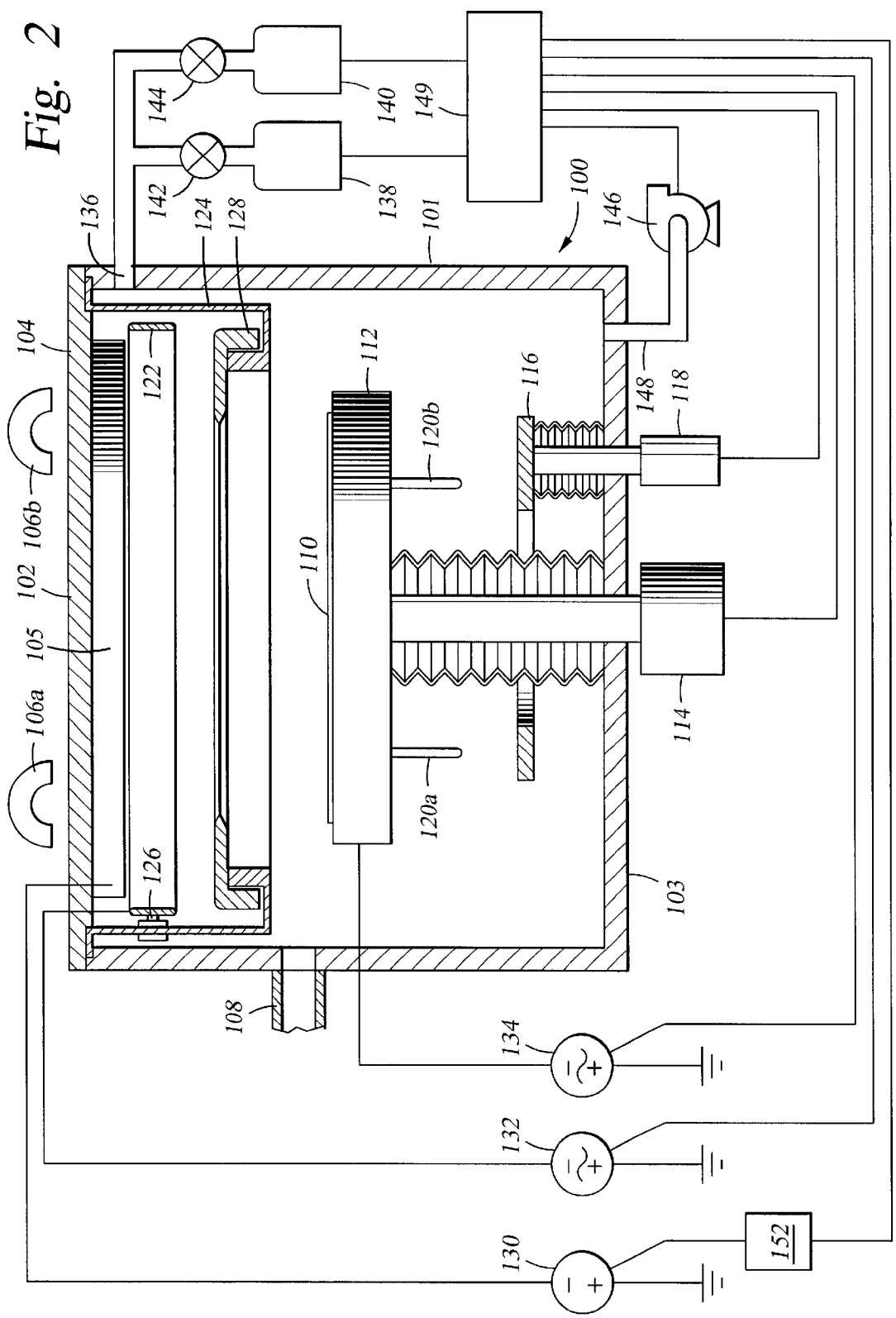
FIG. 2 is a schematic side view of an ionized metal plasma (IMP) chamber.

FIG. 2 is a schematic cross-sectional view of an IMP chamber 100 in which the invention may be used to advantage. An ion metal plasma (IMP) processing chamber, known as an IMP VECTRA™ chamber is available from Applied Material Inc. of Santa Clara, Calif. The IMP chamber can be integrated into an Endura® platform, also available from Applied Materials, Inc. The chamber 100 includes sidewalls 101, lid 102, and bottom 103. The lid 102 includes a target backing plate 104 which supports a target 105 of the material to be deposited. An opening 108 in the chamber 100 provides access for a robot (not shown) to deliver and retrieve substrates 110 to and from the chamber 100. A substrate support 112 supports the substrate 110 and is typically grounded. The substrate support 112 is mounted on a lift motor 114 that raises and lowers the substrate support 112 and a substrate 110 disposed thereon. A lift plate 116 connected to a lift motor 118 is mounted in the chamber 100 and raises and lowers pins 120a, 120b mounted in the substrate support 112. The pins 120a, 120b raise and lower the substrate 110 from and to the surface of the substrate support 112. A coil 122 is mounted between the substrate support 112 and the target 105 and provides inductively-coupled magnetic fields in the chamber 100 to assist in generating and maintaining a plasma between the target 105 and substrate 110. Power supplied to the coil 122 densifies the plasma which ionizes the sputtered material. The ionized material is then directed toward the substrate 110 and deposited thereon. A shield 124 is disposed in the chamber 100 to shield the chamber sidewalls 101 from the sputtered material. The shield 124 also supports the coil 122 by supports 126. The supports 126 electrically insulate the coil 122 from the shield 124 and the chamber 100. The clamp ring 128 is mounted between the coil 122 and the substrate support 112 and shields an outer edge and backside of the substrate from sputtered materials when the substrate is raised into a processing position to engage the lower portion of the clamp ring. In some chamber configurations, the shield 124 supports the clamp ring 128 when the substrate 110 is lowered below the shield 124 to enable substrate transfer.

Three power supplies are used in the IMP chamber 100 shown in FIG. 2. A power supply 130 delivers preferably DC power for conductive materials to the target 105 to cause the processing gas to form a plasma. Magnets 106a, 106b disposed behind the target backing plate 104 increase the density of a plasma adjacent to the target 105 and increase the sputtering efficiency. A power source 132, preferably a RF power source, supplies electrical power at about 13.56 MHz to the coil 122 to increase the density of the plasma. Another power source 134, typically a DC power source, biases the substrate support 112 with respect to the plasma and provides directional attraction of the ionized sputtered material toward the substrate 110.

Processing gas, such as an inert gas of argon or helium, is supplied to the chamber 100 through a gas inlet 136 from gas sources 138, 140 as metered by respective mass flow controllers 142, 144. A vacuum pump 146 is connected to the chamber 100 at an exhaust port 148 to exhaust the chamber 100 and maintain the desired pressure in the chamber 100.

A controller 149 controls the functions of the power supplies, lift motors, mass flow controllers for gas injection, vacuum pump, and other associated chamber components and functions. The controller 149 preferably comprises a programmable microprocessor and executes system control software stored in a memory, which in the preferred embodiment is a hard disk drive, and can include analog and digital input/output boards, interface boards, and stepper motor controller boards (not shown). The controller 149 controls electrical power to the components of the chamber and includes a panel that allows an operator to monitor and operate the chamber. Optical and/or magnetic sensors (not shown) are generally used to move and determine the position of movable mechanical assemblies.

In operation, a robot (not shown) delivers a substrate 110 to the chamber 100 through the opening 108. The pins 120a, 120b are extended upward, lift the substrate 110 from the robot, and the robot retracts from the chamber 100. The pins 120a, 120b lower the substrate 110 to the surface of the substrate support 112. The substrate support 112 raises the substrate 110 to engage the clamp ring 128. A processing gas is injected into the chamber 100 and a plasma is generated between the target 105 and the substrate support 112 with power from the power source 130. The power source 132 delivers power to the coil, which densifies the plasma and ionizes the sputtered target material leaving the target 105 to form sputtered material ions. The sputtered material ions are accelerated toward the biased substrate 110. The process pressure may be operated from about 5 to about 100 mTorr to increase the ionization probability of the sputtered material atoms as the atoms travel through the plasma region. After deposition, the substrate support is lowered, the pins 120a, 120b are raised to lift the substrate 110, a robot (not shown) enters the chamber 100, retrieves the substrate 110, and if desired, delivers another substrate for processing.

Figure 3:
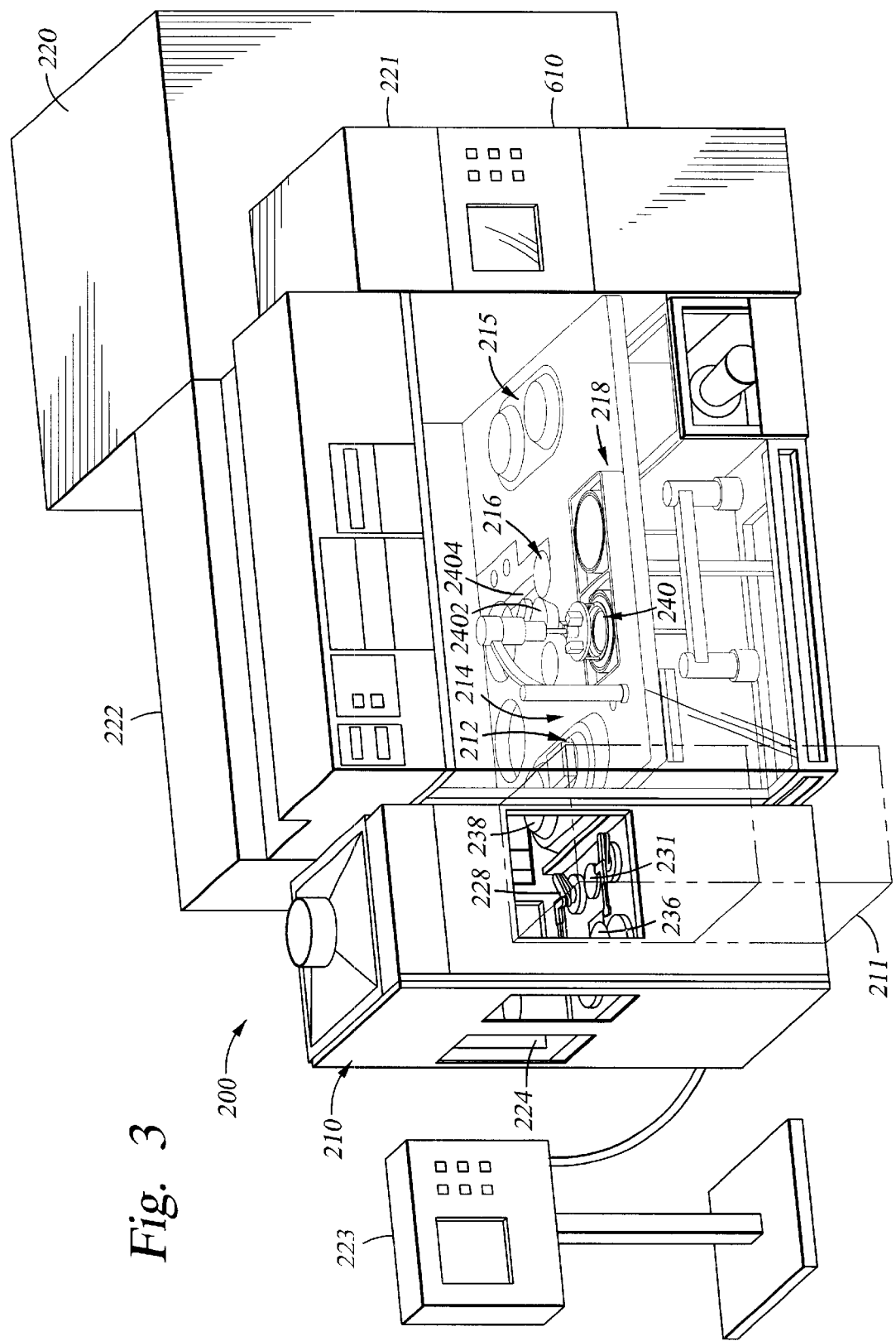
FIG. 3 is a perspective view of an electroplating system platform.
Figure 4:
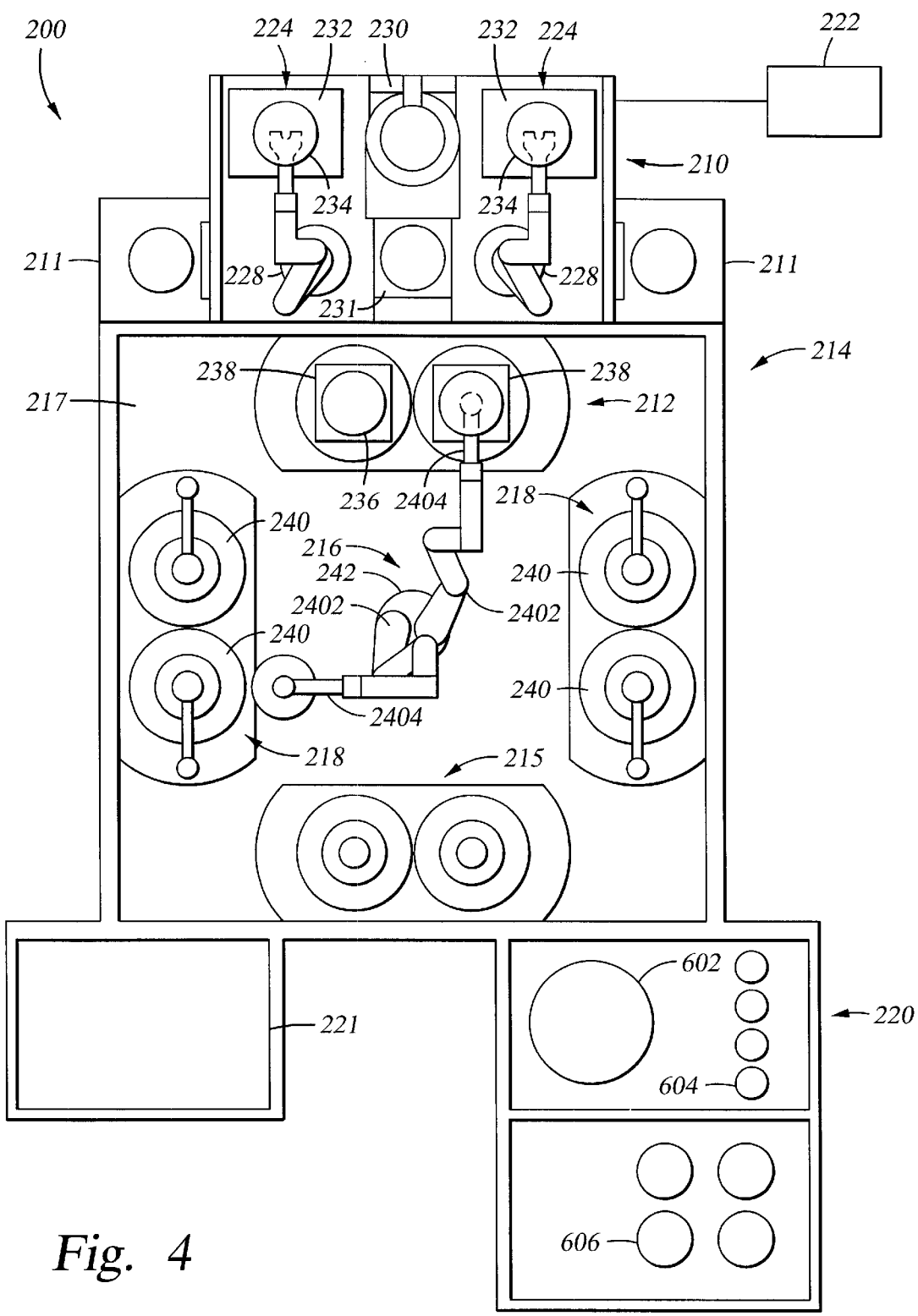
FIG. 4 is a schematic top view of an electroplating system platform.

FIG. 3 is a perspective view of an electroplating system platform 200 in which the electroless deposition process can be performed and is described in co-pending U.S. patent application Ser. No. 09/289,074, entitled "Electro-Chemical Deposition System", filed on Apr. 8, 1999, which is incorporated herein by reference. FIG. 4 is a schematic top view of an electroplating system platform 200. Referring to both FIGS. 3 and 4, the electroplating system platform 200 generally comprises a loading station 210, a thermal anneal chamber 211, a mainframe 214, and an electrolyte replenishing system 220. The mainframe 214 generally comprises a mainframe transfer station 216, a spin-rinse dry (SRD) station 212, a plurality of processing stations 218, and a seed layer enhancement station 215. Preferably, the electroplating system platform 200, particularly the mainframe 214, is enclosed in a clean environment using panels such as Plexiglas panels. The mainframe 214 includes a base 217 having cut-outs to support various stations needed to complete the electrochemical deposition process. The base 217 is preferably made of aluminum, stainless steel or other rigid materials that can support the various stations disposed thereon. A chemical protection coating, such as Halar™, ethylene-chloro-trifluoro-ethaylene (ECTFE), or other protective coatings, is preferably disposed over the surfaces of the base 217 that are exposed to potential chemical corrosion. Each processing station 218 includes one or more processing cells 240. An electrolyte replenishing system 220 is positioned adjacent the mainframe 214 and connected to the process cells 240 individually to circulate electrolyte used for the electroplating process. The electroplating system platform 200 also includes a power supply station 221 for providing electrical power to the system and a control system 222, typically comprising a programmable microprocessor.

The loading station 210 preferably includes one or more substrate cassette receiving areas 224, one or more loading station transfer robots 228 and at least one substrate orientor 230. A number of substrate cassette receiving areas, loading station transfer robots 228 and substrate orientor included in the loading station 210 can be configured according to the desired throughput of the system. As shown for one embodiment in FIGS. 3 and 4, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the electroplating system platform. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211. The loading station 210 preferably also includes a substrate cassette 231 for temporary storage of substrates as needed to facilitate efficient transfer of substrates through the system.

FIG. 4 also shows a mainframe transfer robot 242 having a flipper robot 2404 incorporated therein. The mainframe transfer robot 242 serves to transfer substrates between different stations attached to the mainframe station, including the processing stations and the SRD stations. The mainframe transfer robot 242 includes a plurality of robot arms 2402 (two shown), and a flipper robot 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation. For example, the flipper robot flips the substrate processing surface face-down for the electroplating process in the processing cell 240 and flips the substrate processing surface face-up for other processes, such as the spin-rinse-dry process. Preferably, the mainframe transfer robot 242 provides independent robot motion along the X-Y-Z axes by the robot arm 2402 and independent substrate flipping rotation by the flipper robot end effector 2404.

The rapid thermal anneal (RTA) chamber 211 is preferably connected to the loading station 210, and substrates are transferred into and out of the RTA chamber 211 by the loading station transfer robot 228. The electroplating system, preferably comprises two RTA chambers 211 disposed on opposing sides of the loading station 210, corresponding to the symmetric design of the loading station 210. Thermal anneal process chambers are generally well known in the art, and rapid thermal anneal chambers are typically utilized in substrate processing systems to enhance the properties of the deposited materials. The invention contemplates utilizing a variety of thermal anneal chamber designs, including hot plate designs and heat lamp designs, to enhance the electroplating results. One particular thermal anneal chamber useful for the present invention is the WxZ chamber available from Applied materials, Inc., located in Santa Clara, Calif.

Figure 5:
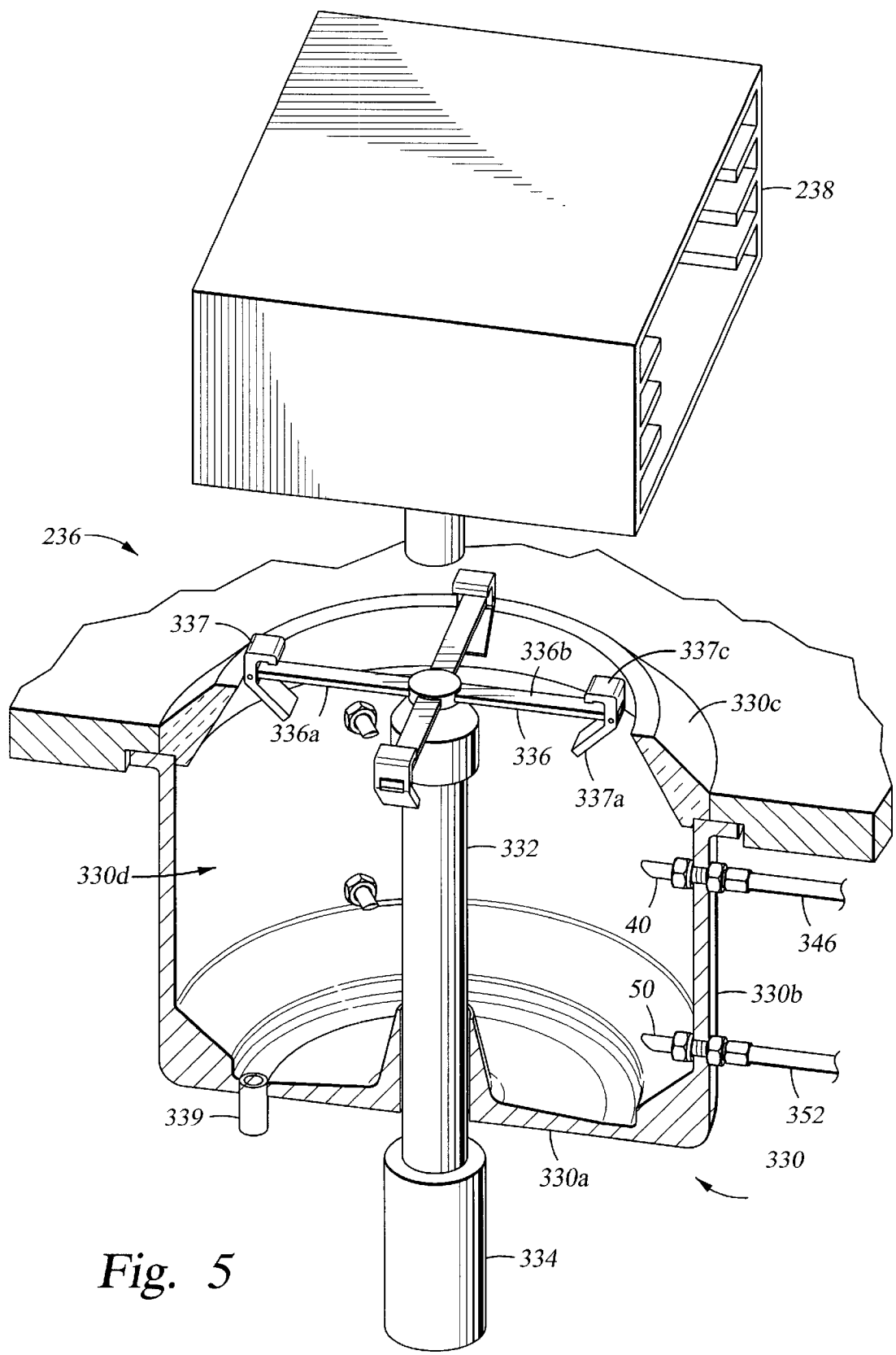
FIG. 5 is a schematic perspective view of a spin-rinse-dry (SRD) module.
Figure 6:
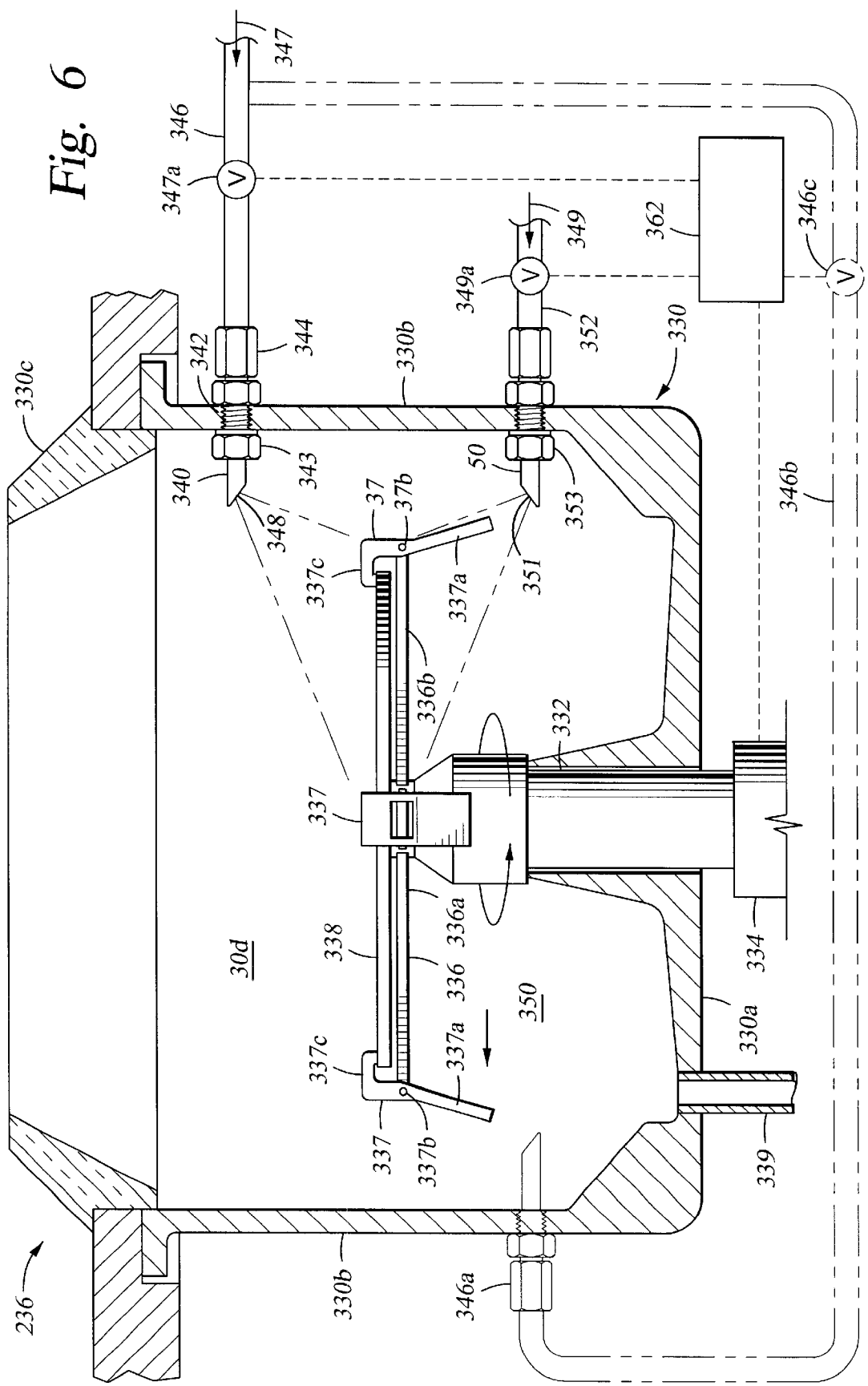
FIG. 6 is a side cross sectional view of the SRD module shown in FIG. 4.

FIG. 5 is a schematic perspective view of a spin-rinse-dry (SRD) module of the present invention, incorporating rinsing and dissolving fluid inlets. FIG. 6 is a side cross sectional view of the spin-rinse-dry (SRD) module of FIG. 5 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

The SRD module 236 comprises a bottom 330a, a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports a substrate 338 (shown in FIG. 5) on the pedestal upper surface during processing. The pedestal actuator 334 rotates the pedestal 336 to spin the substrate 338 and raises and lowers the pedestal as described below. The substrate may be held in place on the pedestal by a plurality of clamps 337. The clamps 337 pivot with centrifugal force and engage the substrate preferably in the edge exclusion zone of the substrate. In a preferred embodiment, the clamps 337 engage the substrate 338 only when the substrate lifts off the pedestal during the processing. Vacuum passages (not shown) may also be used as well as other holding elements. The pedestal has a plurality of pedestal arms 336a and 336b, so that the fluid through the second nozzle may impact as much surface area on the lower surface of the substrate as is practical. An outlet 339 allows fluid to be removed from the SRD module.

A first conduit 346 in the SRD module, through which a first fluid 347 flows, is connected to a valve 347a. The conduit may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 362. The conduit 346 connects to a first fluid inlet 340 that is located above the substrate and includes a mounting portion 342 to attach to the SRD module and a connecting portion 344 to attach to the conduit 346. The first fluid inlet 340 is shown with a single first nozzle 348 to deliver a first fluid 347 under pressure onto the substrate upper surface. However, multiple nozzles could be used and multiple fluid inlets could be positioned about the inner perimeter of the SRD module 238. Preferably, nozzles placed above the substrate 338 should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit 346 and related elements described above, a second conduit 352 is connected to a control valve 349a and a second fluid inlet 350 with a second nozzle 351. The second fluid inlet 350 is shown below the substrate and angled upward to direct a second fluid under the substrate 338 through the second nozzle 351. Similar to the first fluid inlet 340, the second fluid inlet 350 may include a plurality of nozzles, a plurality of fluid inlets and mounting locations, and a plurality of orientations including using the articulating member 353. Each fluid inlet could be extended into the SRD module 236 at a variety of positions. For instance, if the flow is desired to be a certain angle that is directed back toward the SRD module periphery along the edge of the substrate, the nozzles could be extended radially inward and the discharge from the nozzles be directed back toward the SRD module periphery.

The controller 362 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c, which may be used to flow a rinsing fluid on the backside of the substrate after the dissolving fluid is flown without having to reorient the substrate or switch the flow through the second fluid inlet to a rinsing fluid.

In one embodiment, the substrate is mounted with the deposition surface face up in the SRD module bowl. As will be explained below, for such an arrangement, the first fluid inlet 340 would generally flow a rinsing fluid, typically deionized water or alcohol. Consequently, the backside of the substrate would be mounted facing down and a fluid flowing through the second fluid inlet 350 would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal 336 is in a raised position, shown in FIG. 5, and a robot (not shown) places the substrate 338, face up, onto the pedestal. The pedestal lowers the substrate to a processing position where the substrate is vertically disposed between the first and the second fluid inlets. Generally, the pedestal actuator 334 rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall 330b, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate 328 significantly lifts off the pedestal 336 during processing. With the pedestal rotating the substrate, a rinsing fluid is delivered onto the substrate face through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the face of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet 346a can flow rinsing fluid on the backside of the substrate to rinse any dissolving fluid residue from the backside. After rinsing the face and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is a fan pattern with a pressure of about 10 to about 15 pounds per square inch (psi) and a flow rate of about 1 to about 3 gallons per minute (gpm) for a 200 mm substrate.

The SRD module 238 is disposed adjacent the loading station 210 and serves as a connection between the loading station 210 and the mainframe 214. Referring to FIGS. 3 and 4, the mainframe 214, as shown, includes two processing stations 218 disposed on opposite sides, each processing station 218 having two processing cells 240. The mainframe transfer station 216 includes a mainframe transfer robot 242 disposed centrally to provide substrate transfer between various stations on the mainframe. Preferably, the mainframe transfer robot 242 comprises a plurality of individual robot arms 2402 that provides independent access of substrates in the processing stations 218 the SRD stations 212, the seed layer enhancement stations 215, and other processing stations disposed on or in connection with the mainframe. As shown in FIG. 3, the mainframe transfer robot 242 comprises two robot arms 2402, corresponding to the number of processing cells 240 per processing station 218. Each robot arm 2402 includes an end effector for holding a substrate during a substrate transfer. Preferably, each robot arm 2402 is operable independently of the other arm to facilitate independent transfers of substrates in the system. Alternatively, the robot arms 2402 operate in a linked fashion such that one robot extends as the other robot arm retracts.

Figure 7:
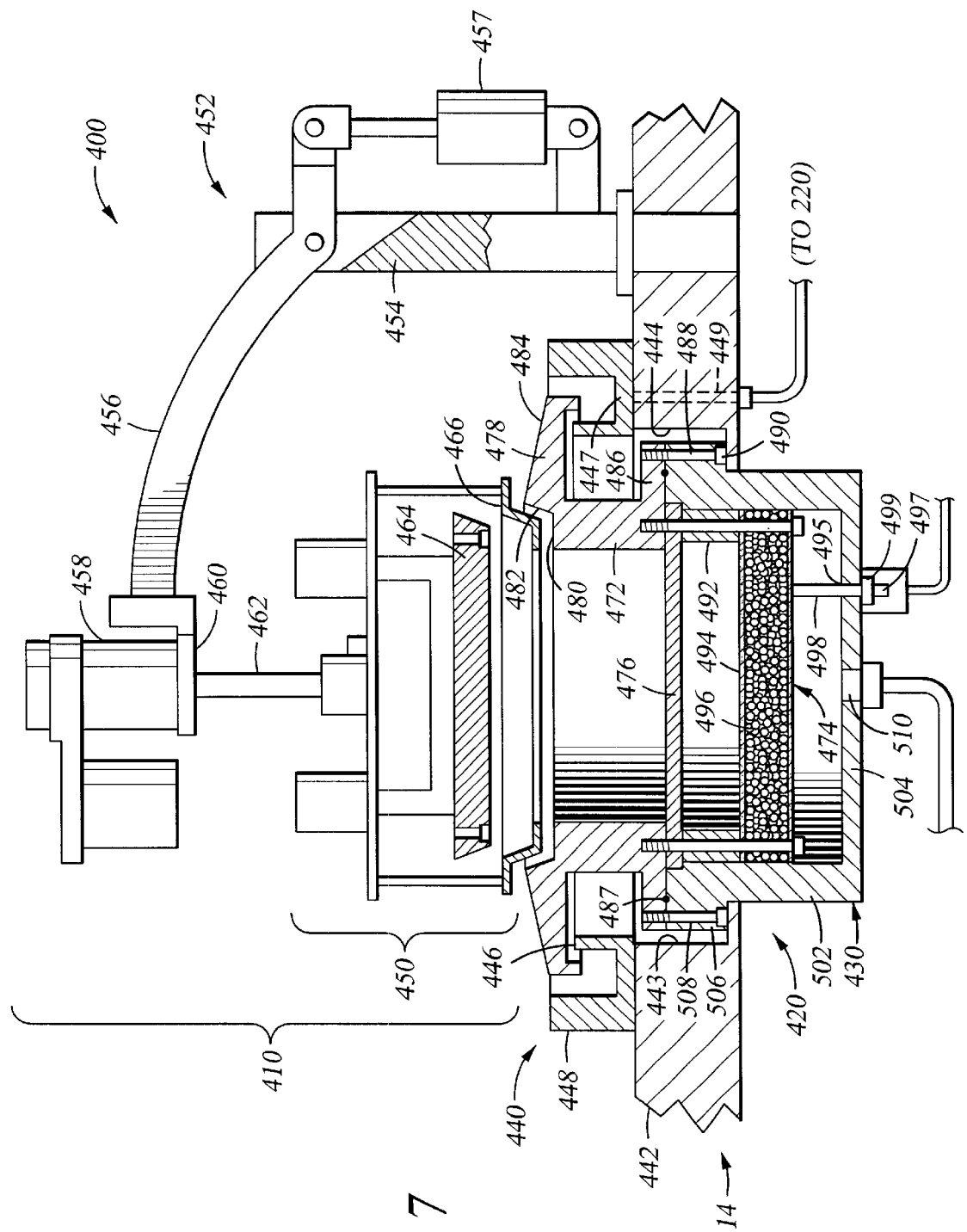
FIG. 7 is a cross sectional view of an electroplating process cell.

FIG. 7 is a cross sectional view of an electroplating process cell 400 used in the system. The electroplating process cell 400 is the same as the electroplating process cell 240 shown in FIGS. 3 and 4. The processing cell 400 generally comprises a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220, shown in FIGS. 3 and 4 through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 8:
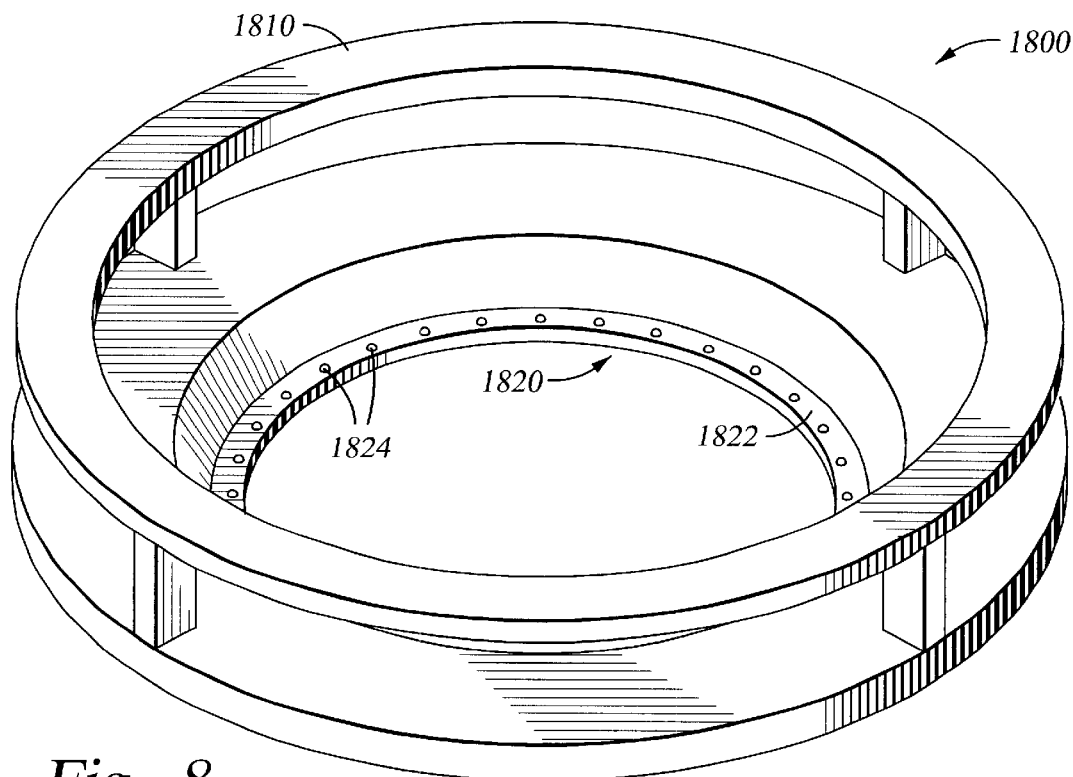
FIG. 8 is a perspective view of a cathode contact ring.

The substrate holder assembly 450 generally comprises a substrate holder 464 and a cathode contact ring 466. FIG. 8 is a perspective view of a cathode contact ring. The cathode contact ring 1800 as shown in FIG. 8 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electrical contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that come in contact with the substrate, are preferably treated to provide hydrophilic surfaces or coated with a material that exhibits hydrophilic properties, such as a hydrophilic surface treatment is available from Millipore Corporation, located in Bedford, Mass. The hydrophilic surface significantly reduces beading of the electrolyte on the surfaces of the cathode contact ring. Other contact ring designs are useful in the electroplating processing cell according to the invention, such as the contact ring designs described in U.S. patent application Ser. No. 09/201,486 entitled "Cathode Contact Ring For Electrochemical Deposition", filed on Nov. 30, 1998, which is incorporated herein by reference.

Figure 9:
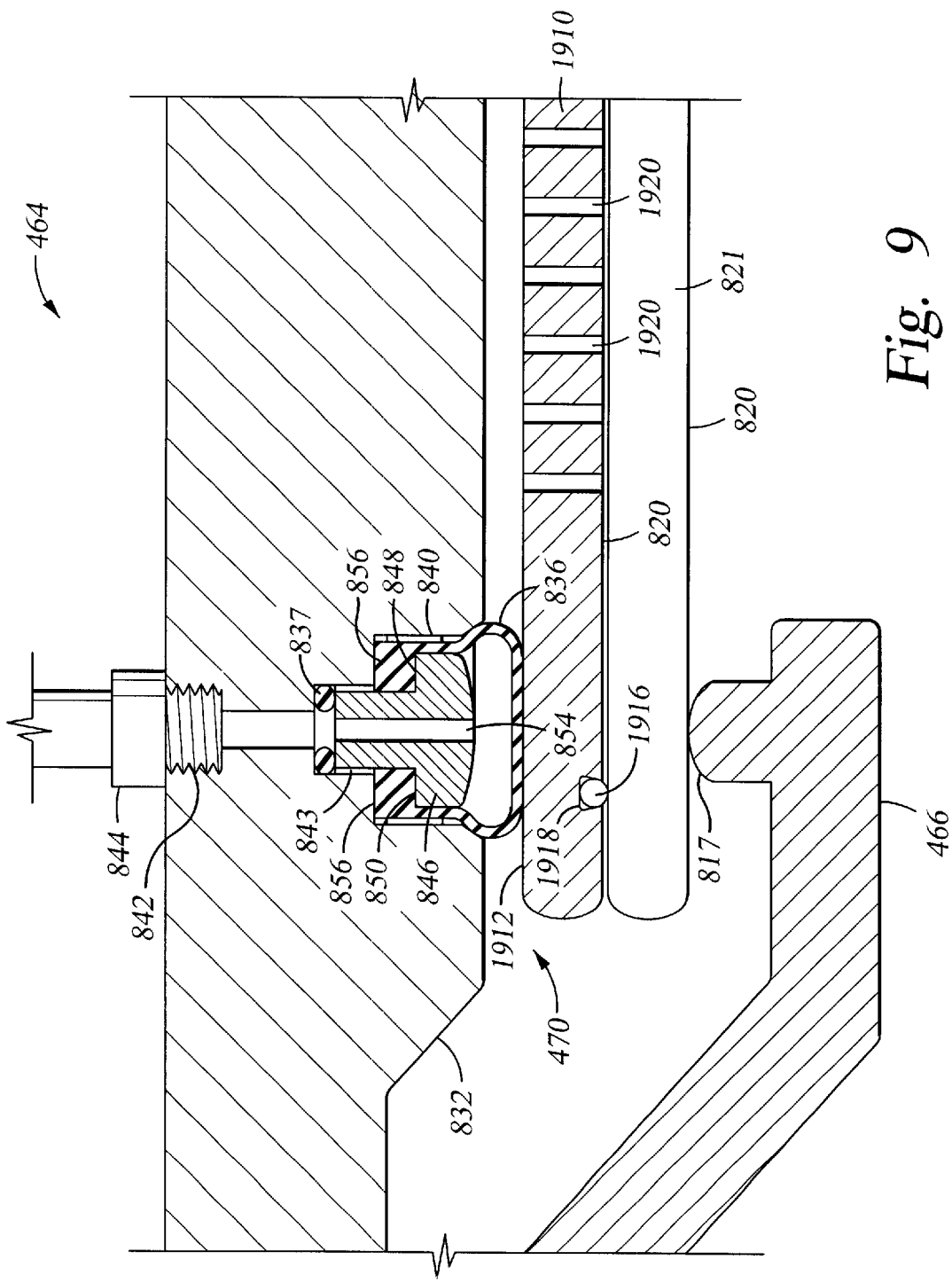
FIG. 9 is a partial cross sectional view of a substrate holder assembly.

FIG. 9 is a partial cross sectional view of a substrate holder assembly. The substrate holder 464 is preferably positioned above the cathode contact ring 466 and comprises a bladder assembly 470 that provides pressure to the backside of a substrate and ensures electrical contact between the substrate plating surface and the cathode contact ring 466.

The inflatable bladder assembly 470 is disposed on a substrate holder plate 832. The bladder assembly 470 includes an inflatable bladder 836 attached to the back surface of an intermediary substrate holder plate 1910. A fluid source (not shown) supplies a fluid, i.e., a gas or liquid, to the bladder 836 allowing the bladder 836 to be inflated to varying degrees. Preferably, a portion of the inflatable bladder 836 is sealingly coupled to the back surface 1912 of the intermediary substrate holder plate 1910 using an adhesive or other bonding material. The front surface 1914 of the intermediary substrate holder plate 1910 is adapted to engage a substrate or substrate 821 to be processed, and an elastomeric O-ring 1916 is disposed in an annular groove 1918 on the front surface 1914 of the intermediary substrate holder plate 1910 to contact a peripheral portion of the substrate back surface. The elastomeric O-ring 1916 provides a seal between the substrate back surface and the front surface of the intermediary substrate holder plate. Preferably, the intermediary substrate holder plate includes a plurality of bores or holes 1920 extending through the plate that are in fluid communication with the vacuum port (not shown) to facilitate securing the substrate on the substrate holder using a vacuum force applied to the backside of the substrate. The inflatable bladder does not directly contact a substrate being processed, and thus, the risk of cutting or damaging the inflatable bladder during substrate transfers is significantly reduced. The elastomeric O-ring 1916 is preferably coated or treated to provide a hydrophilie surface (as discussed above for the surfaces of the cathode contact ring) for contacting the substrate, and the elastomeric O-ring 1916 is replaced as needed to ensure proper contact and seal to the substrate. Other bladder are useful in the electroplating processing cell according to the invention, such as the bladder system described in U.S. patent application Ser. No. 09/201,796 entitled "Inflatable Compliant Bladder Assembly", filed on Nov. 30, 1998, which is incorporated herein by reference.

Referring back to FIG. 6, a cross sectional view of an electroplating process cell 400, the substrate holder assembly 450 is positioned above the process kit 420. The process kit 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, Plexiglas (acrylic), lexane, PVC, CPVC, and PVDF. Alternatively, the container body 472 can be made from a metal, such as stainless steel, nickel and titanium, which is coated with an insulating layer, such as Teflon, PVDF, plastic, rubber and other combinations of materials that do not dissolve in the electrolyte and can be electrically insulated from the electrodes (i.e., the anode and cathode of the electroplating system). The container body 472 is preferably sized and adapted to conform to the substrate plating surface and the shape of the of a substrate being processed through the system, typically circular or rectangular in shape. One preferred embodiment of the container body 472 comprises a cylindrical ceramic tube having an inner diameter that has about the same dimension as or slightly larger than the substrate diameter. The inventors have discovered that the rotational movement used in typical electroplating systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte collector 440 to allow removal and replacement of the process kit 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nuts/bolts combination facilitates fast and easy removal and replacement of the components of the process kit 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430. The filter 476 preferably comprises a ceramic diffuser that also serves to control the electrolyte flow pattern toward the substrate plating surface.

The anode assembly 474 preferably comprises a consumable anode that serves as a metal source in the electrolyte. Alternatively, the anode assembly 474 comprises a non-consumable anode, and the metal to be electroplated is supplied within the electrolyte from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electro-chemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable (i.e., soluble) anode provides gas-generation-free electrolyte and minimizes the need to constantly replenish the metal in the electrolyte.

An anode electrode contact 498 is inserted through the anode enclosure 494 to provide electrical connection to the soluble metal 496 from a power supply. Preferably, the anode electrode contact 498 is made from a conductive material that is insoluble in the electrolyte, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension (i.e., circumference) of the upper annular flange 506 is about the same as the outer dimension (i.e., circumference) of the lower annular flange 486. Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Referring back to FIGS. 3 and 4, the electroplating system platform 200 includes a control system 222 that controls the functions of each component of the platform. Preferably, the control system 222 is mounted above the mainframe 214 and comprises a programmable microprocessor. The programmable microprocessor is typically programmed using a software designed specifically for controlling all components of the electroplating system platform 200. The control system 222 also provides electrical power to the components of the system and includes a control panel 223 that allows an operator to monitor and operate the electroplating system platform 200. The control panel 223 is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the controller of the electrolyte replenishing system 220 to provide the electrolyte for the electroplating process.

Preferably, the electroless deposition applicator is a separate cell or module that performs the electroless deposition process, herein referred to as an electroless deposition processing (EDP) cell. The EDP cell can be located at the rearward portions, distal from the entry of the substrates, of the electroplating system platform 200. In the embodiment shown, two EDP cells can be arranged side-by-side for greater throughput rates.

FIG. 10 is a schematic perspective view of one EDP cell 3010. The EDP cell 3010 includes a bottom 3012, a sidewall 3014, and an angularly disposed upper shield 3016 attached to the sidewall 3014 and open in the middle of the shield. Alternatively, a removable cover (not shown) could be used. A pedestal 3018 is generally disposed in a central location of the cell 3010 and includes a pedestal actuator 3020. The pedestal actuator 3020 rotates the pedestal 3018 to spin a substrate 3022 mounted thereon between about 10 to about 2000 RPMs. The pedestal can be heated so that the substrate temperature is between about 15° C. to about 100° C., and preferably about 60° C. A pedestal lift 3024 raises and lowers the pedestal 3018. The substrate 3022 can be held in position by a vacuum chuck 3026 mounted to the top of the pedestal 3018. In addition, the pedestal 3018 can lower the substrate 3022 to a vertical position aligned with a plurality of clamps 3028. The clamps 3028 pivot with centrifugal force and engage the substrate 3022 preferably on an edge of the substrate. The pedestal 3018 also includes a downwardly disposed annular shield 3030 of greater diameter than a corresponding upwardly disposed annular shield 3032 coupled to the bottom of the cell 3010. The interaction of the two annular shields 3030, 3032 protects the pedestal 3018 and associated components from the fluids in the cell 3010. At least one fluid outlet 3034 is disposed in the bottom of the 3010 cell to allow fluids to exit the cell.

A first conduit 3036, through which an electroless deposition fluid flows, is coupled to the cell 3010. The conduit 3036 can be a hose, pipe, tube, or other fluid containing conduit. An electroless deposition fluid valve 3038 controls the flow of the electroless deposition fluid, where the valves disclosed herein can be a needle, globe, butterfly, or other type of valve and can include a valve actuator, such as a solenoid. An electroless deposition fluid container 3044 is connected to the valve 3038 that can be controlled with a controller 3040. A series of valves 3042a–f are connected to various chemical sources (not shown), where the valves 3042a–f can be separately controlled with the controller 3040. Preferably, the electroless deposition fluid is mixed on an as-needed basis in individual application quantities for deposition on the substrate 3022 and not significantly before the deposition to avoid premature electroless deposition in the conduit 3036 and associated elements. The valves 3038, 3042a–f are therefore preferably located in close proximity to the cell 3010. The first conduit 3036 connects to an first fluid inlet 3046 disposed above the substrate 3022 when the substrate is disposed in a lowered position and preferably is coupled to an articulating member 3048, such as a ball and socket joint, to allow movement of the inlet 3046 and to allow adjustment of the angle of the inlet 3046 in the cell 3010. A first nozzle 3050 is connected to the end of the inlet 3046 and is directed toward the pedestal 3018. The fluid(s) is generally delivered in a spray pattern, which may be varied depending on the particular nozzle spray pattern desired and may include a fan, jet, conical, and other patterns. Preferably, the nozzle 3050 is located outside the periphery of the substrate 3022 to allow the substrate to be raised and lowered without interference. Alternatively, the nozzle 3050 can be articulated toward the periphery of the cell 3010 with an actuator (not shown) that moves the nozzle 3050 laterally, vertically or some combination thereof to provide vertical clearance for the substrate 3022 as the substrate is raised or lowered.

Similar to the first conduit and related elements, a second conduit 3052 is disposed through the sidewall 3014. The second conduit 3052 provides a path for rinsing fluid, such as deionized water or alcohol, that is used to rinse the substrate 3022 after the electroless deposition. A second inlet 3054 is connected to the second conduit 3052 and a second nozzle 3056 is connected to the second inlet 3054. An articulating member 3059 is coupled to the second inlet 3054 and can be used to allow movement and adjustment of the angle of the inlet relative to the cell 3010. A second valve 3058 is connected to the second conduit 3052 and preferably controls the rinsing fluid timing and flow. The second conduit can also be coupled to a source of low concentration of acid or other fluids and a valve for controlling the fluid. Alternatively, the acid supply can be coupled to a separate conduit (not shown). Exemplary fluids include hydrochloric acid, sulfuric acid, phosphoric acid, hydrofluoric acid, or other liquids or fluids that can be used to coat the substrate surface after the electroless deposition to protect the layer from oxidation and other contaminants prior to the electroplating process. The substrate can thus be transferred for subsequent processing such as electroplating in a "wet" state to minimize oxidation and other contaminants. The ability to transfer in a wet state is further enhanced if the substrate is maintained in a face up position for a period of time subsequent to the electroless deposition process.

The controller 3040 preferably controls each valve and therefore each fluid timing and flow. The controller 3040 preferably also controls the substrate spin and raising and lowering of the pedestal and hence the substrate disposed thereon. The controller 3040 could be remotely located, for instance, in a control panel (not shown) or control room and the plumbing controlled with remote actuators.

In operation, a robot (not shown) delivers the substrate 3022 face up to the EDP cell 3010. The substrate 3022 already has a seed layer deposited thereon such as by PVD or IMP processing. The pedestal raises 3018 and the vacuum chuck 3026 engages the underside of the substrate 3022. The robot retracts and the pedestal 3018 lowers to a processing elevation. The controller 3040 actuates the valves 3042a–f to provide chemicals into the electroless fluid container 3044, the chemicals are mixed, and the controller actuates the electroless deposition fluid valve 3038 to open and allow a certain quantity of electroless deposition fluid into the first inlet 3046 and through the first nozzle 3050. Preferably, the pedestal 3018 spins at a relatively slow speed of about 10 to about 500 RPMs, allowing a quantity of fluid to uniformly coat the substrate 3022. The spin direction can be reversed in an alternating fashion to assist in spreading the fluid evenly across the substrate. The electroless deposition fluid valve 3038 is closed. The electroless deposition fluid auto-catalytically forms a layer over the pre-deposited seed layer and joins vacancies in the prior deposited layer to provide a more complete coating even in high aspect ratio features. Preferably, the electroless deposition process deposits from about 100 Å to about 400 Å for most substrates.

The second valve 3058 opens and a rinsing fluid flows through the second conduit 3052 and is sprayed onto the substrate 3022 through the second nozzle 3056. Preferably, the pedestal 3018 rotates at a faster speed of about 100 to about 500 RPMs as the remaining electroless deposition fluid is rinsed from the substrate 3022 and is drained through the outlet 3034 and discarded. The substrate can be coated with an acid or other coating fluid. In some instances, the pedestal 3018 can spin at a higher speed of about 500 to about 2000 RPMs to spin dry the substrate 3022.

The pedestal 3018 stops rotating and raises the substrate 3022 to a position above the EDP cell 3010. The vacuum chuck 3026 releases the substrate 3022 and the robot retrieves the substrate for further processing in the electroplating cell.

Figure 12:
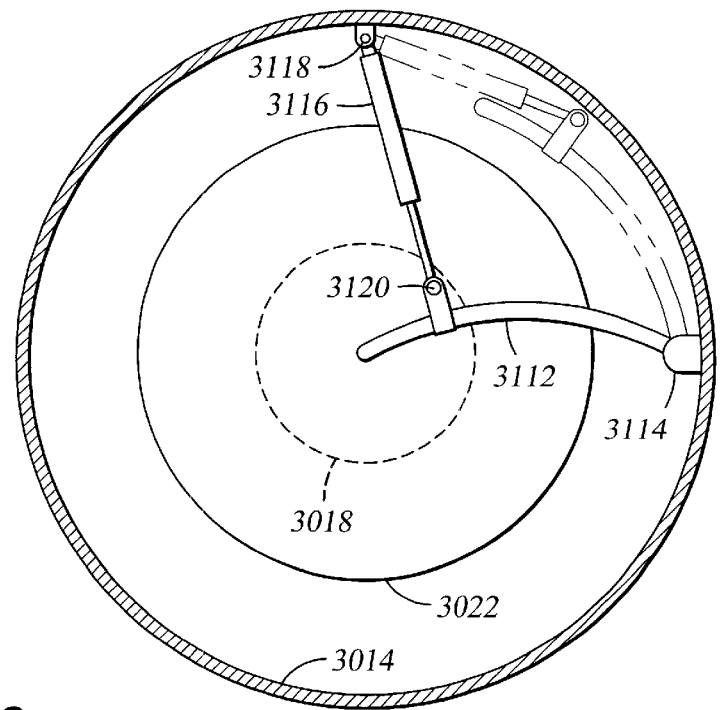
FIG. 12 is a schematic top view of the EDP cell shown in FIG. 11.

FIG. 11 is a schematic side view of an alternative embodiment of an EDP cell and FIG. 12 is a schematic top view of the EDP cell shown in FIG. 11. The EDP cell 3110 is similar to the EDP cell 3010 shown in FIG. 10 and includes similar conduits and valving, a pedestal, vacuum chuck, and a pedestal lift. The principal difference in EDP cell 3110 is a first inlet 3112 that extends toward the center of the pedestal 3018 and the substrate 3022. The first inlet 3112 articulates about an articulating member 3114 disposed in proximity to the sidewall 3014. An actuator 3116 is connected on one end to the sidewall 3014 at a first pivot 3118 and on a distal end to the first inlet 3112 at a second pivot 3120. The actuator 3116 provides for movement of the first inlet 3112 from a central position above the substrate 3022 to a peripheral position proximate the sidewall 3014 when the substrate 3022 is raised and lowered in the cell 3110. The actuator 3116 can also be controlled by the controller 3040.

In operation, the substrate 3022 is delivered to the ECP cell 3110 by a robot (not shown). The substrate 3022 is lowered on the vacuum chuck 3026 below the vertical elevation of the first inlet 3112. The first inlet 3112 is pushed to a central position above the substrate 3022 by the actuator 3116. The valves 3042*a–f* allow appropriate quantities of chemicals into the container 3044 for mixing and the valve 3038 opens to allow a quantity of electroless deposition fluid into the first inlet 3112. The first inlet 3112 drops a quantity, or globule, of electroless deposition fluid onto the substrate 3022 and the pedestal 3018 spins the substrate at an RPM adapted to displace the liquid across the substrate surface in a substantially uniform fashion. Depending on the viscosity of the liquid, the rotational speed of the substrate 3022 can be from about 10 to about 500 RPMs. The spin direction of the pedestal can be reversed to assist in even distribution of the fluid. The substrate 3022 can be rinsed as described in reference to FIG. 10. The actuator 3116 moves the first inlet 3112 toward the sidewall 3014 of the cell 3110 and the pedestal 3018 raises the substrate 3022 through the top of the cell 3110 to be retrieved by the robot.

Figure 13:
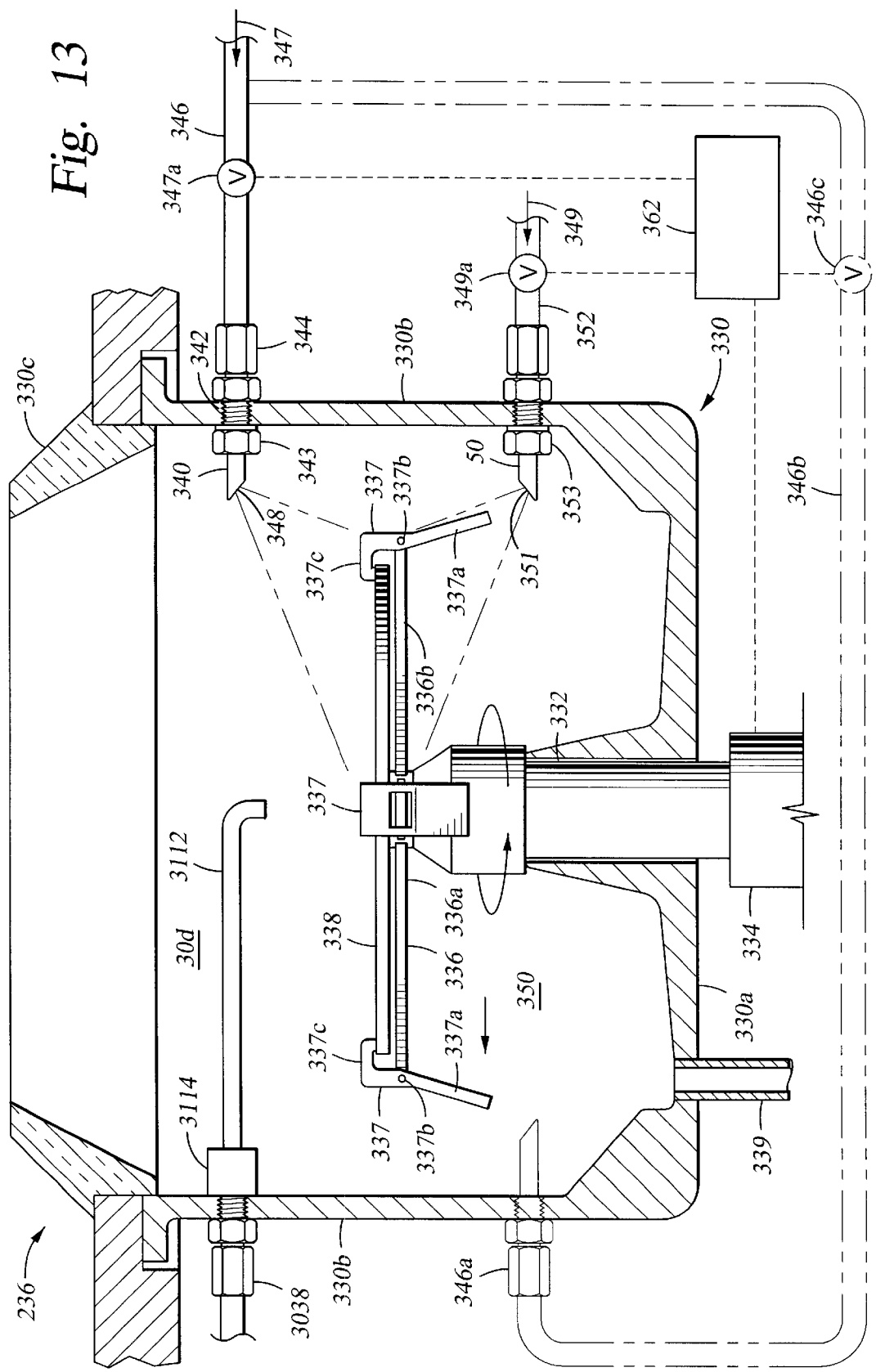
FIG. 13 is a schematic side view of an exemplary embodiment of a combined EDP/SRD cell.

Another option for an electroless deposition applicator using the electroless deposition process is to combine the EDP cell with the SRD cell. For instance, the first conduit 3036 and first inlet 3112 described in reference to FIGS. 11 and 12 with associated valving, such as valve 3038, can be included with the SRD chamber described in reference to FIGS. 5 and 6. FIG. 13 is a side view of an exemplary embodiment of the combined EDP/SRD cell using the embodiment of the SRD module described in reference to FIGS. 5 and 6 and the embodiment of the EDP cell described in references to FIGS. 11 and 12. The components of FIG. 13 are similarly numbered as the counterpart components of FIGS. 5, 6, 11 and 12 and the descriptions of such components are incorporated into the description relevant to FIG. 13. A primary difference between the SRD chamber described in FIGS. 5 and 6 and the combined EDP/SRD cell is the inclusion of a first inlet 3112 disposed through the sidewall 330*b* and extending to a central position above the substrate 338. The first inlet 3112 is connected to the valve 3038 and is used to control a quantity of electroless deposition fluid delivered through the first inlet to the substrate. An actuator, as shown in FIGS. 11 and 12, is connected to the first inlet 3112 and can be used to articulate the first inlet 3112 about an articulating member 3114 from the central position to a peripheral position in proximity to the sidewall 330*b*. A pedestal 336 supports the substrate 338 on the pedestal upper surface during processing. A pedestal actuator 334 rotates the pedestal to spin the substrate and raises and lowers the pedestal. In operation, the substrate 338 can be rinsed and dried, the electroless deposition fluid deposited onto the substrate 338, the substrate rotated to spin the fluid across the substrate, and a coating fluid applied to the substrate surface to protect the electroless deposition. The substrate can also be rinsed and/or dried.

Figure 14:
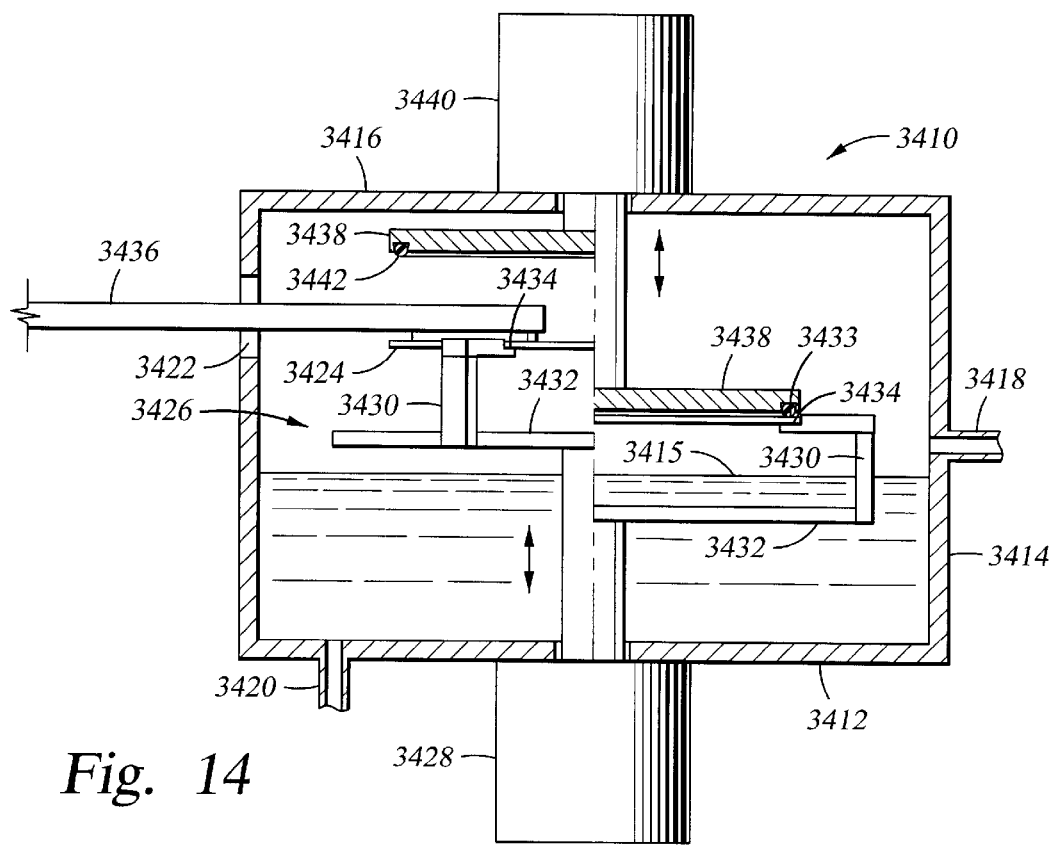
FIG. 14 is a schematic side view of another embodiment of an EDP cell.
Figure 15:
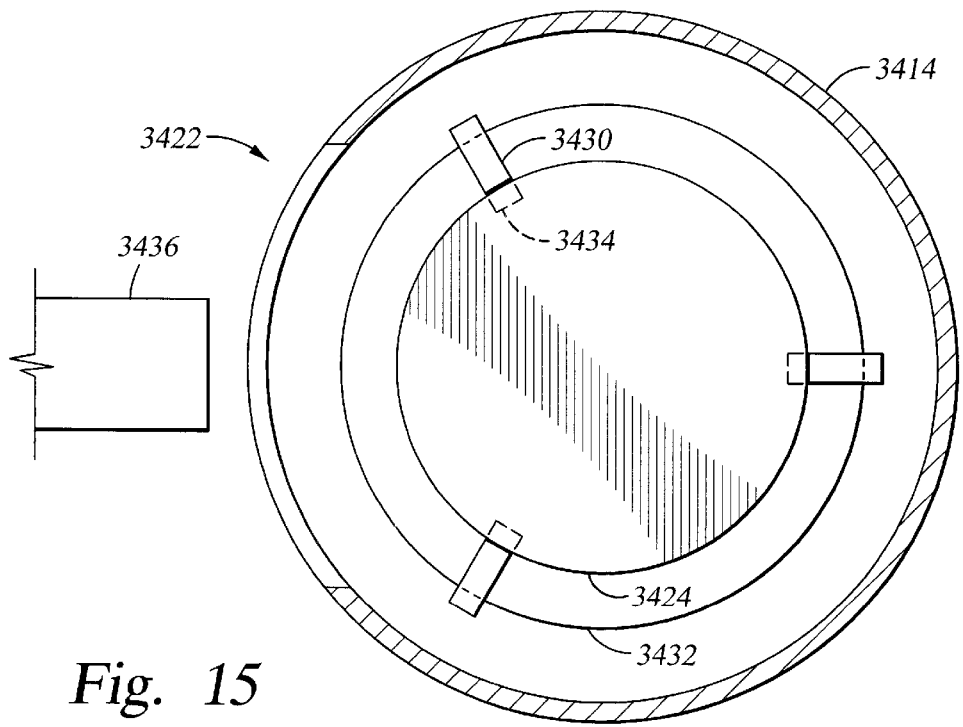
FIG. 15 is a schematic top view of the EDP cell shown in FIG. 14.

FIG. 14 is a side view schematic of another embodiment of an EDP cell 3410 and FIG. 15 is a top view of the EDP cell 3410. The bath-type EDP cell 3410 includes a bottom 3412, a sidewall 3414, and a top 3416. An inlet 3418 in the sidewall 3414 allows delivery of a quantity of electroless deposition fluid 3415 into the EDP cell 3410. An outlet 3420 in the bottom of the EDP cell 3410 allows the electroless deposition fluid 3415 to be drained from the EDP cell 3410. The electroless fluid can be replenished, recirculated, and filtered using a replenishing system (not shown) similar to the electrolyte replenishing system 220 described in reference to FIGS. 3 and 4. An opening 3422 is disposed in the sidewall 3414 and is sized to allow a substrate 3424 to be delivered through the opening 3422. A substrate support 3426 is mounted in the EDP cell 3410 and coupled to a lower actuator 3428. The lower actuator 3428 is used to raise and lower the substrate support 3426. The substrate support 3426 preferably includes at least three risers 3430 coupled to a base 3432 on the substrate support 3426. Each riser 3430 has a step 3434 adapted to support the substrate 3424 on an edge exclusion area 3433, typically about 1 mm to about 5 mm wide around the outer periphery of the substrate 3424. The risers 3430 are spaced apart with sufficient distance to allow a robot blade 3436 to deliver a substrate 3424 into the EDP cell 3410 between the risers 3430. Alternatively, the substrate support 3426 can include a circumferential ring (not shown), instead of individual risers, with a slot for the robot blade 3436 to deliver the substrate 3424 to the step 3434. A downwardly extending substrate holder 3428 is coupled to an upper actuator 3440 where the actuator 3440 lowers and raises the substrate holder 3438 to engage and maintain the substrate 3424 in position on the substrate support 3426. An elastomeric seal 3442, such as an O-ring, is disposed circumferentially on the substrate holder between the substrate holder and the substrate. Alternatively, the seal 3442 can be similar to the bladder 836 and related components described in reference to FIGS. 9.

In operation, a quantity of electroless deposition fluid is flown into the EDP cell 3410 to a depth below the opening 3422. A substrate 3424, supported on a robot blade 3436 on a backside of the substrate 3424, is flipped so that the substrate face is disposed downward to be processed. The substrate 3424 is delivered to the EDP cell 3410 through the opening 3422. The lower actuator 3428 raises the substrate support 3426 and engages the substrate 3424. The robot blade 3436 retracts from the cell 3410. The substrate support 3426 lowers and engages the substrate 3424 to maintain the substrate position on the substrate support 3426 and preferably seals the backside from the electroless deposition fluid 3415. The substrate 3424 is lowered into the electroless deposition fluid 3415, a layer of conductive material is deposited on the substrate 3424 by an electroless deposition process, and the substrate 3424 is raised from the electroless deposition fluid 3415. The upper actuator 3440 disengages from the substrate 3424 and the robot blade 3436 reenters the EDP cell 3410. The lower actuator 3428 raises the substrate 3424 into contact with the robot blade 3436 and the robot blade exits the EDP cell 3410 with the substrate 3424 for further processing, such as rinsing at the SRD module 236 referenced in FIGS. 5 and 6.

The EDP cells can be disposed in a variety of locations in the processing system. In addition to the referenced location at the rearward position of the ECP system or in combination with the SRD cell, the EDP cell(s) can also be located above the SRD module(s) 236 shown in FIGS. 5 and 6. For instance, as described in reference to FIGS. 5 and 6, the substrate pass-through cassette 238 is positioned above each SRD module 236 and allows the loading station transfer robot 228 to deliver the substrate and the mainframe transfer robot 242 to retrieve the substrate. Likewise, an EDP cell could be disposed above an SRD module instead of the pass-through cassette so that the loading station transfer robot 228 delivers the substrate to the EDP cell and the mainframe transfer robot 242 retrieves the substrate from the EDP cell subsequent to an electroless deposition in the EDP cell.

Figure 16:
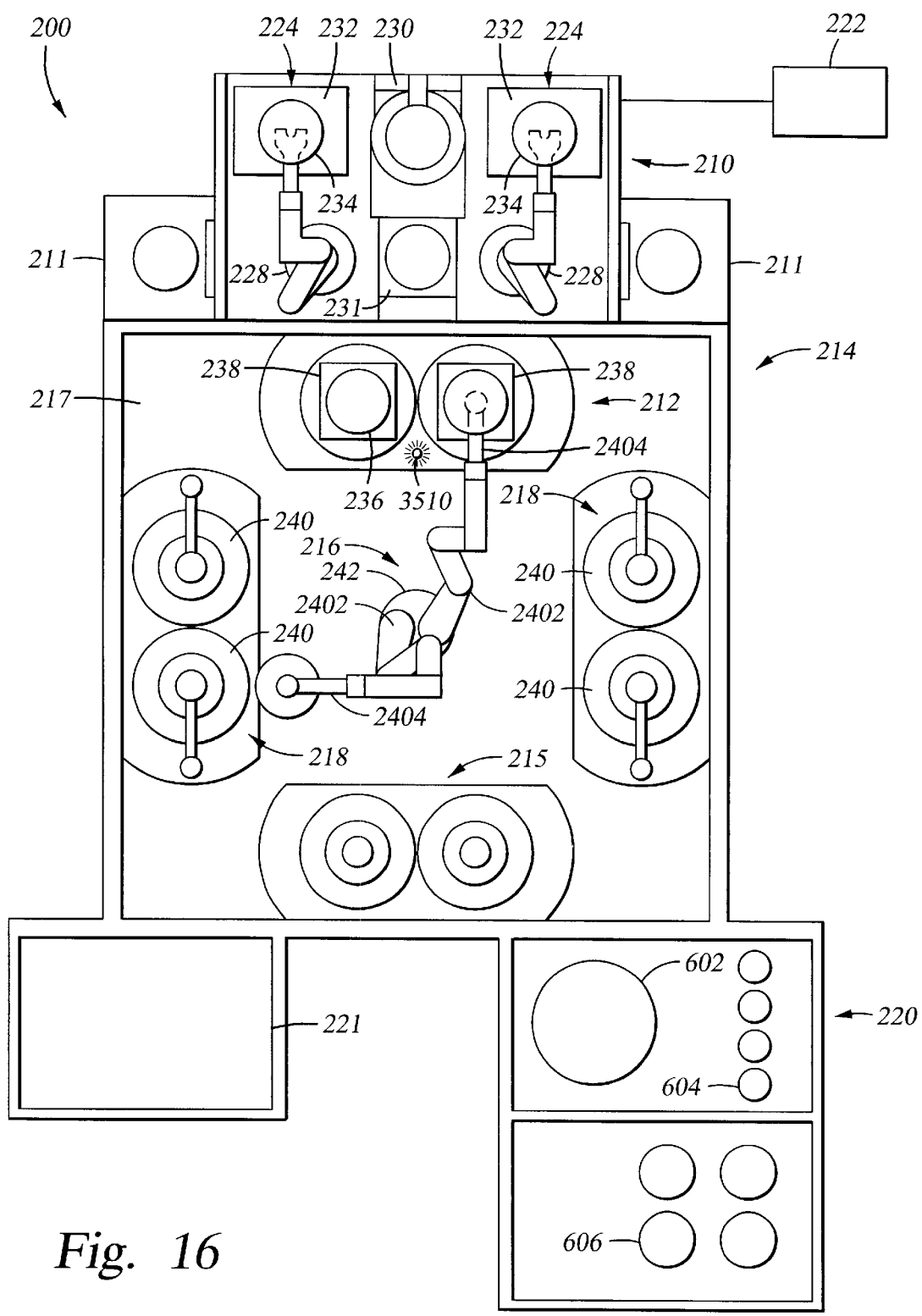
FIG. 16 is a schematic top view of an electroplating system platform having an "on-the-fly" electroless deposition fluid outlet.

Furthermore, an electroless deposition alternative to a separate EDP cell is electroless deposition "on-the-fly", for example, during transfer of the substrate or while the substrate is in a transfer area awaiting transfer to a subsequent process sequence. FIG. 16 is a schematic top view of the electroplating system platform 200 described in reference to FIGS. 3 and 4 with similarly numbered components. In this embodiment, the electroless deposition applicator includes an electroless deposition nozzle 3510, preferably mounted in the area serviced by the flipper robot 2404. The nozzle 3510 is connected to a supply of electroless deposition fluid which is controlled by valving in a similar manner as described in reference to FIG. 10. The nozzle 3510 is preferably disposed in an existing travel path of the flipper robot 2404 as it obtains a substrate 234 from the substrate pass-through cassette 238 while the substrate 234 is face up. Alternatively, the nozzle 3510 can be mounted above the substrate pass-through cassette 238. In operation, a quantity of electroless deposition fluid is sprayed onto the substrate 234 through the nozzle 3510. Preferably, at least some of the travel time of the substrate 234 between process sequences is used to allow the electroless deposition fluid to react and deposit a layer of conductive material to increase throughput rates. The flipper robot 2404 can then flip the substrate 234 for subsequent electroplating processing. Alternatively, if rinsing is needed, the robot can deliver the substrate to the SRD station 212 for rinsing prior to subsequent processing.

The following is a description of a typical substrate electroplating process sequence through the electroplating system platform 200. The process sequence described below is exemplary of various other process sequences or combinations that can be performed utilizing the electrochemical deposition platform. A substrate cassette containing a plurality of substrates is loaded into the substrate cassette receiving areas 224 in the loading station 210 of the electroplating system platform 200. In a preferred process, the substrates have had a seed layer of conductive material such as copper deposited thereon by an IMP process in an IMP chamber 100 prior to loading the substrates into the electroplating system. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 238 at the SRD station 212. The mainframe transfer robot 242 picks up the substrate from the substrate pass-through cassette 238 and secures the substrate on the flipper robot end effector 2404. The mainframe transfer robot 242 transfers the substrate to the EDP cell 215, and a seed layer enhancement process is performed utilizing electroless deposition.

After the electroless deposition process, the mainframe transfer robot transfers the substrate to the processing cell 240 for the electroplating process. Alternatively, the substrate can be transferred to the SRD cell for rinsing and drying, before transfer to the processing cell. The flipper robot end effector 2404 rotates and positions the substrate face down in the substrate holder assembly 450. The substrate is positioned below the substrate holder 464 but above the cathode contact ring 466. The flipper robot end effector 2404 then releases the substrate to position the substrate into the cathode contact ring 466. The substrate holder 464 moves toward the substrate and the vacuum chuck secures the substrate on the substrate holder 464. The bladder assembly 470 on the substrate holder assembly 450 exerts pressure against the substrate backside to ensure electrical contact between the substrate plating surface and the cathode contact ring 466.

The head assembly 452 is lowered to a processing position above the process kit 420. At this position, the substrate is below the upper plane of the weir 478 and contacts the electrolyte contained in the process kit 420. The power supply is activated to supply electrical power (i.e., voltage and current) to the cathode and the anode to enable the electroplating process. The electrolyte is typically continually pumped into the process kit during the electroplating process. The electrical power supplied to the cathode and the anode and the flow of the electrolyte are controlled by the control system 222 to achieve the desired electroplating results. Preferably, the head assembly is rotated as the head assembly is lowered and also during the electroplating process.

After the electroplating process has been completed, the head assembly 410 raises the substrate holder assembly and removes the substrate from the electrolyte. Preferably, the head assembly is rotated for a period of time to enhance removal of residual electrolyte from the substrate holder assembly. The vacuum chuck and the bladder assembly of the substrate holder then release the substrate from the substrate holder, and the substrate holder is raised to allow the flipper robot end effector 2404 to pick up the processed substrate from the cathode contact ring. The flipper robot end effector 2404 is moved to a position above the backside of the processed substrate in the cathode contact ring and picks up the substrate using the vacuum suction gripper on the flipper robot end effector. The mainframe transfer robot retracts the flipper robot end effector with the substrate out of the processing cell 240 and the flipper robot end effector flips the substrate from a face-down position to a face-up position.

The substrate is then transferred into the SRD module. The SRD substrate support lifts the substrate, and the mainframe transfer robot retracts out of the SRD module 236. The substrate is cleaned using a spin-rinse-dry process in the SRD module using deionized water or a combination of deionized water and a cleaning fluid. The substrate is then positioned for transfer out of the SRD module.

The loading station transfer robot 228 picks up the substrate from the SRD module 236 and transfers the processed substrate into the RTA chamber 211 for an anneal treatment process to enhance the properties of the deposited materials. The annealed substrate is then transferred out of the RTA chamber 211 by the loading station robot 228 and placed back into the substrate cassette for removal from the electroplating system. The above-described sequence can be carried out for a plurality of substrates substantially simultaneously in the electroplating system platform 200 of the present invention. Also, the electroplating system according to the invention can be adapted to provide multi-stack substrate processing.

The terms "below", "above", "bottom", "top", "up", "down", "upper", and "lower" and other positional terms used herein are shown with respect to the embodiments in the figures and may be varied depending on the relative orientation of the processing apparatus.

While foregoing is directed to the preferred embodiment of the present invention, other and further embodiments of the invention may be devised without departing from the basic scope thereof, and the scope thereof is determined by the claims that follow.

What is claimed is:

1. A system for depositing a conductive layer on a substrate, comprising:
   an electroplating processing mainframe having a transfer robot and one or more electroplating cells;
   an electroless deposition applicator coupled to the mainframe, the applicator comprising a nozzle positioned to distribute electroless deposition fluid over the substrate; and
   an electroless deposition fluid supply fluidly connected to the electroless deposition applicator.

2. The system of claim 1, wherein the nozzle is disposed above the mainframe and positioned above a path of the substrate being transferred by the transfer robot.

3. The system of claim 2, wherein the nozzle is disposed proximate to a substrate pass-through cassette disposed on the mainframe.

4. The system of claim 1, wherein the nozzle is disposed in an electroless deposition process (EDP) cell.

5. The system of claim 4, wherein the EDP cell comprises a pedestal for supporting the substrate in the EDP cell.

6. The system of claim 5, wherein the EDP cell comprises an actuator disposed in connection with the pedestal to rotate the pedestal.

7. The system of claim 5, wherein the EDP cell comprises a rinse fluid inlet disposed proximate to the pedestal and fluidly connected to a supply of rinsing fluid.

8. The system of claim 5, wherein the nozzle is disposed proximate to a center of the pedestal and coupled to an articulating member.

9. The system of claim 8, further comprising an actuator coupled to the articulating member to move the nozzle from a central position above the pedestal to a peripheral position proximate to a sidewall of the EDP cell.

* * * * *